United States Patent [19]

Khayrallah et al.

[11] Patent Number: 5,745,502
[45] Date of Patent: Apr. 28, 1998

[54] ERROR DETECTION SCHEME FOR ARQ SYSTEMS

[75] Inventors: Ali S. Khayrallah, Apex; David R. Irvin, Raleigh, both of N.C.

[73] Assignee: Ericsson, Inc., Research Triangle Park, N.C.

[21] Appl. No.: 723,217

[22] Filed: Sep. 27, 1996

[51] Int. Cl.⁶ .................. H03M 13/00; H04L 1/02; H04L 1/08; H04L 1/18
[52] U.S. Cl. .................. 371/35; 371/37.06; 371/37.9; 371/41; 371/68.2
[58] Field of Search .................. 371/68.2, 35, 37.06, 371/37.9, 41

[56] References Cited

U.S. PATENT DOCUMENTS 5,241,548   8/1993   Dillon et al. .................. 371/69.1
5,497,382   3/1996   Levine et al. .................. 371/35
5,577,053   11/1996   Dent .................. 371/37.4
5,687,188   11/1997   Feeney et al. .................. 375/220

*Primary Examiner*—Stephen M. Baker
*Attorney, Agent, or Firm*—Rhodes, Coats & Bennett, L.L.P.

[57] ABSTRACT

A method of error correction for an ARQ system allows decoding when an even number of flawed packets are received. Multiple flawed replications of a transmitted bit sequence are compared bit-by-bit. A set of composite packets is formed containing all possible combinations of values at the disputed bit positions. A validity check is performed on each of the composite packets. If only a single composite packet passes the validity check, an acknowledgment signal is sent.

17 Claims, 10 Drawing Sheets

| 1 | 0 | 0 | 1 | 0 | 0 | 0 | 1 | 1 | 1 |

| 1 | 0 | 0 | 1 | 0 | 0 | 1 | 1 | 1 | 1 |

| 1 | 0 | 0 | 1 | 1 | 0 | 0 | 1 | 1 | 1 |  ELIMINATE (REPLICATION 1)

| 1 | 0 | 0 | 1 | 1 | 0 | 1 | 1 | 1 | 1 |

| 1 | 1 | 0 | 1 | 0 | 0 | 0 | 1 | 1 | 1 |

| 1 | 1 | 0 | 1 | 0 | 0 | 1 | 1 | 1 | 1 |  ELIMINATE (REPLICATION 2)

| 1 | 1 | 0 | 1 | 1 | 0 | 0 | 1 | 1 | 1 |

| 1 | 1 | 0 | 1 | 1 | 0 | 1 | 1 | 1 | 1 |

FIGURE 5

ERROR DETECTION SCHEME FOR ARQ SYSTEMS

FIELD OF THE INVENTION

This invention relates in general to data communication systems, and more specifically to error detection for automatic repeat request (ARQ) systems that are subject to high bit-error ratio (BER) transmission.

BACKGROUND OF THE INVENTION

In digital communications systems, block codes are used to add redundant information to the data transmitted to enable the detection and/or correction of any errors that might occur during transmission. One commonly used type of code is called a cyclic redundancy check (CRC). Cyclic redundancy codes are capable of detecting large numbers of errors with a minimum amount of redundancy, and can be implemented with simple logic circuits. These advantages have led to the widespread use of CRC codes in digital communication systems.

One drawback to CRC checks is that CRC checks permit detection of errors but do not allow forward correction of the errors. Thus, CRC checks are frequently used in automatic repeat request (ARQ) systems in which the receiving module can communicate back with the originating module. In essence, the receiving module checks incoming packets or frames for transmission errors by examining a frame-check sequence that is generated by a cyclic-redundancy check and appended to the packet by the originating module. If the incoming packet arrives without evident error, the terminating module sends an acknowledgment packet called an ACK to the originating module. If the incoming packet is flawed by transmission errors, the terminating module discards the packet and withholds its ACK (or alternatively sends a negative acknowledgment, or NACK). When the ACK is withheld, the originating module deduces that the packet was not received correctly by the terminating module, and the originating module re-sends the packet.

Traditional ARQ systems as described above have a long history, which is described in detail by Bertsekas and Gallager (*Data Networks*, Prentice-Hall, 1987 pp. 58–73). Improvements to the traditional ARQ schemes are disclosed in U.S. Pat. No. 5,241,548 as follows: When a packet arrives flawed by transmission errors, it is stored in a buffer rather than discarded by the terminating module. Whenever three flawed packets are so accumulated, the terminating module performs a bit-by-bit majority-logic vote on the three flawed replications of the packet. From the results of this vote, the terminating module constructs a new, composite packet. If the frame-check sequence for the composite packet is valid, the terminating module sends an acknowledgment to the originating module; otherwise, the buffer is purged, the process begins anew, and the terminating module awaits the automatic retransmission of the packet in question.

Variations of the basic ARQ scheme have evolved over time, primarily in response to the needs of terrestrial transmission links, which normally have low BER, with the general result that channel efficiency and throughput have increased. Nevertheless, none of the various schemes presented to date fully optimizes channel throughput and efficiency in the presence of channel errors, particularly in mobile radio-based transmission systems, which may sporadically be subject to high BER.

More specifically, the method disclosed in U.S. Pat. No. 5,241,548 requires that three replications of the packet be received before the added power of the majority-logic vote comes into play—a decision based on two received packets cannot be made with confidence. If the packet cannot be decoded properly after three replications, the only alternative to restarting the entire process would be to wait for a total of five replications, because a majority logic operation needs an odd number of replications in order to preclude voting ties. Amassing an odd number of replications, however, be that number three or five, would introduce substantial waste in cases wherein the packet could be decoded properly with two or four replications.

Moreover, the requirement for an odd number of packets is especially limiting when the physical layer supporting the module comprises a diversity receiver. Typically, a diversity receiver employs two antennas and derives two estimates of the incoming signal. This kind of structure inherently has the capability to supply an even number of packet replications for examination. This capability is completely wasted, however, when such a diversity receiver supports a terminating module having an ARQ module that functions according to the prior art, because the prior-art ARQ module inherently has the limitation that an odd number of packet replications are needed.

Another problem encountered in prior art ARQ systems occurs when part of the information protected by the CRC changes from replication to replication and another part of the information protected by the CRC remains the same. This situation could arise, for example, when a data packet contains a header field that carries information concerning synchronization, sequencing, addressing, network management, or other information used by lowered layers of the communication protocol. In this situation, information in the header field, such as a sequence member, might change from replication to replication, while the text field remains the same. Because the CRC is computed on the header as well as the text fields, any changes to the header between replications will result to change in the CRC even though the text field remains the same.

SUMMARY OF THE INVENTION

The present invention relates to a terminating module for an ARQ protocol. In a preferred embodiment, packets received with transmission errors are held in storage rather then discarded. Whenever an even number of flawed replications of a transmitted packet are present in storage, a count is made of the number of bits wherein the various replications differ. This count is compared with a threshold that is predetermined or adapted, where the level of the threshold is chosen depending on the application's tolerance for undetected transmission error, or depending on an assessment of available processor resources or, in the case of a portable terminal, depending on an assessment of available battery reserve. If the number of disputed bits fall below this threshold, a set of all possible transmitted bit patterns is constructed under the assumption that any bit not disputed was received without transmission error. The CRC of each possible transmitted bit pattern is examined. If exactly one of these CRCs is found to be valid, an ACK is sent from the terminating module awaits the arrival of the next replication of the transmitted packet. Whenever an odd number of flawed replications of a transmitted packet are in storage, a composite packet is formed by majority-logic vote. If the CRC of the composite is valid, an ACK is sent. In another embodiment, that pertains to a diversity receiver, we employ the improved terminating module as described above to process and decode pairs of flawed packets.

The present invention improves the operation of the terminating module, and thereby provides maximum channel throughput, conserves channel bandwidth, minimizes end-to-end packet delay, and optimizes the capability of a diversity receiver. These considerations have paramount importance when the physical-layer resources of the communication channel are capacity-limited and prone to errors, as in the case of a mobile-radio link implemented by cellular, band mobile radio, or satellite transmission equipment having low link margin, or where the mobile-radio link is blocked temporarily by opaque obstructions, or where the mobile-radio link is experiencing temporarily unfavorable conditions imposed by severe weather. Further objects of the invention are to provide a method applicable to hand-held radio terminals wherein the processor resources or battery resources that are devoted to an ARQ protocol module can be limited or adapted in response to changing transmission channel conditions, or in response to the level of battery reserves, or in response to the application-layer's tolerance for undetected errors.

BRIEF DESCRIPTION OF THE DRAWINGS

FIG. 5 continues the example introduced in FIG. 4, and shows the construction of a set of composite packets.

DESCRIPTION OF THE INVENTION

Figure 1:
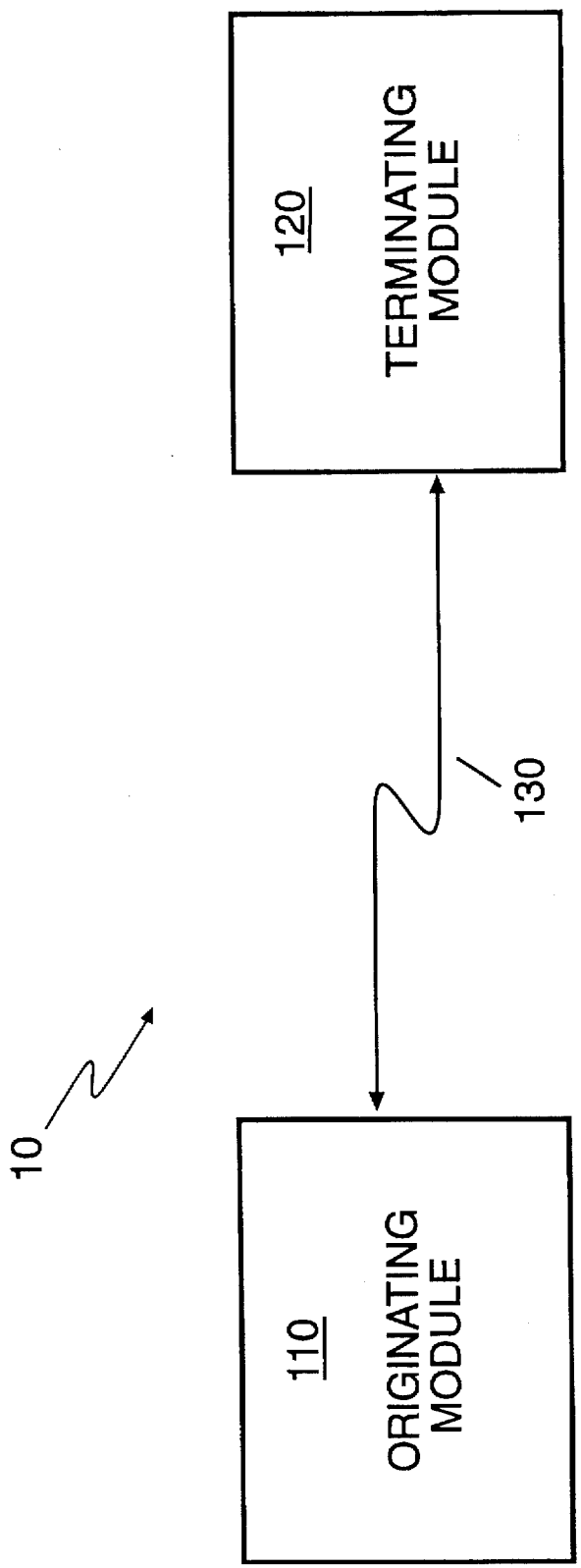
FIG. 1 shows an originating module and a terminating module interconnected by a data link connection, as taught by the prior art.

Referring now to the drawings, there is shown a schematic diagram of a data communication system in which the error control system of the present invention may be embodied. The data communication system is indicated generally by the numeral 10. The data communication system 10 includes an originating module 110 connecting via a communication link 130 to a terminating module 120. The originating module 110 sends packets or frames of data to the terminating module 120 over the communication link 130. The communication link 130 may be provided by mobile-radio wireless equipment, or by fixed wireless equipment, or by some combination of fixed and mobile-radio wireless equipment, or by terrestrial circuits and data-circuit terminating equipment.

The originating module 110 formats the data to make it suitable for transmission over the communication channel. The formatting of data to make it compatible with the channel requirements is referred to as source coding. After source coding, the data is encoded by adding additional bits to the data stream which will enable the detection of channel errors in the received data stream. The additional data bits are called redundant bits. The process of adding redundant bits to a data stream to enable error detection at the receiving end is called error coding.

One well known example of an error detection technique is known as the cyclic redundancy check (CRC). Most CRC codes are used error detection but not error correction. Other block codes and convolutional codes allow both error detection and error correction. When CRC codes are used for error detection, the terminating module 120 checks the received data for any errors that might have occurred during transmission. If the received packet is received without evident error, the receiving module 120 sends an acknowledgment packet called an ACK to the originating module 110. If the received packet is flawed by channel errors, the ACK is withheld. In this case (ACK withheld), the originating module 110 resends the packet after a predetermined period of time has elapsed. This type of system is called an Automatic Repeat Request (ARQ) system.

Figure 2:
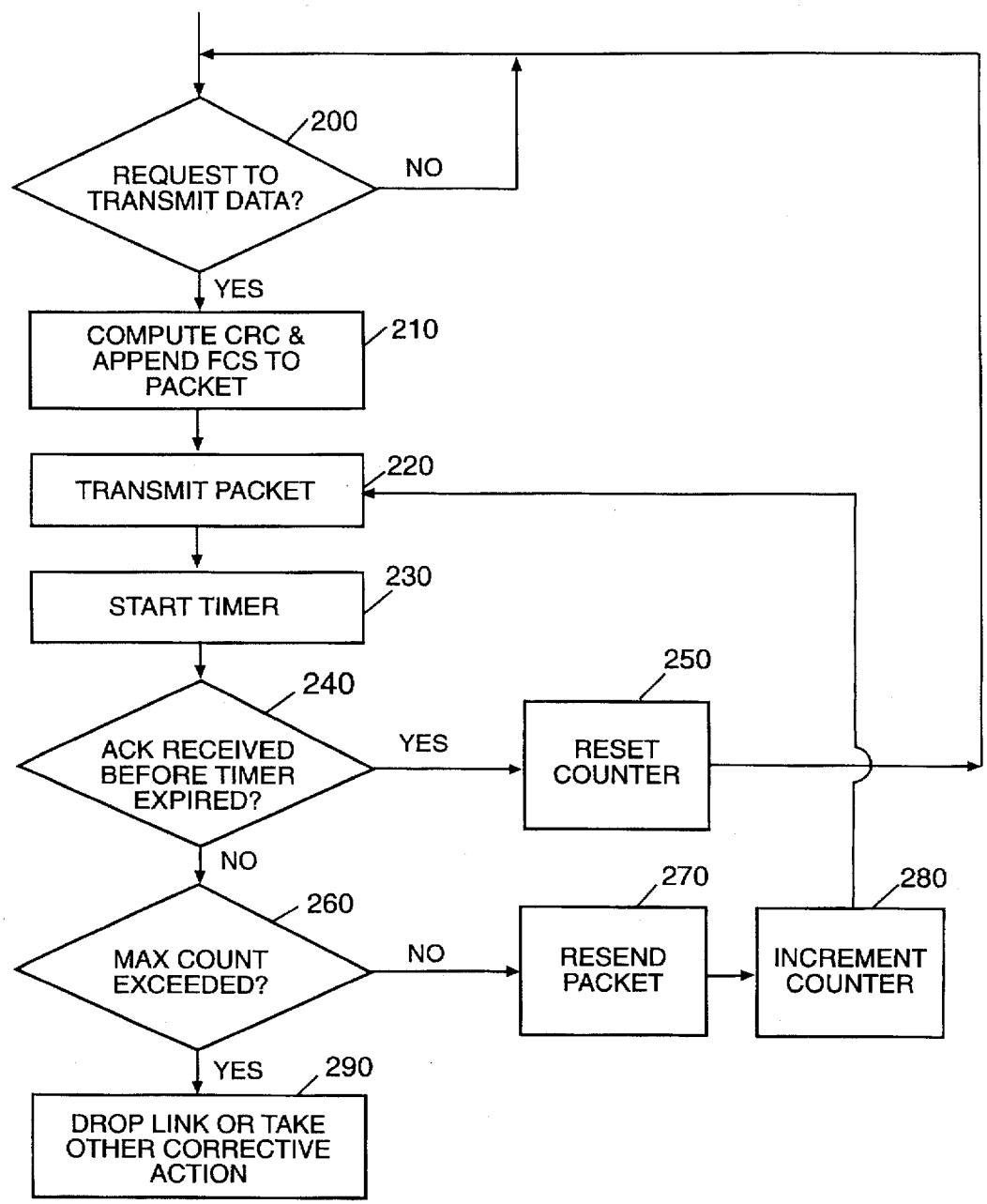
FIG. 2 shows the operation of a simple ARQ protocol from the point of view of an originating DLC module, as taught by the prior art.

FIG. 2 shows the operation of originating module 110 in a ARQ system. When a request to transmit data is received (block 200), the originating module 110 computes the CRC and appends the frame-check bits to the source information (block 210). The packet is then transmitted via the communication link 130 (block 220). Next, originating module 110 starts a timer (block 230). If an ACK is received from terminating module 120 before the expiration of timer (block 240), originating module 110 deduces that terminating module 120 has received the packet correctly. The originating module 110 then zeroes a packet-repeat count (block 250) and awaits the next request for service. Otherwise (i.e., an ACK is not received from module 110 before timer 230 expires), the originating module 110 deduces that module 120 has not correctly received the packet. The originating module 110 then checks the packet-repeat count (block 260), which is a count kept for the purpose of limiting the number of times a packet may be retransmitted. If the packet-repeat count has not reached its maximum permissible value, the packet is re-sent to the terminating module 120 (block 270), and the packet-repeat count is incremented (block 280). Otherwise, (i.e., the packet-repeat count has reached its maximum permissible value), communication data link connection 130 is dropped or corrective measures are taken as taught in the prior art (block 290).

Figure 3A:
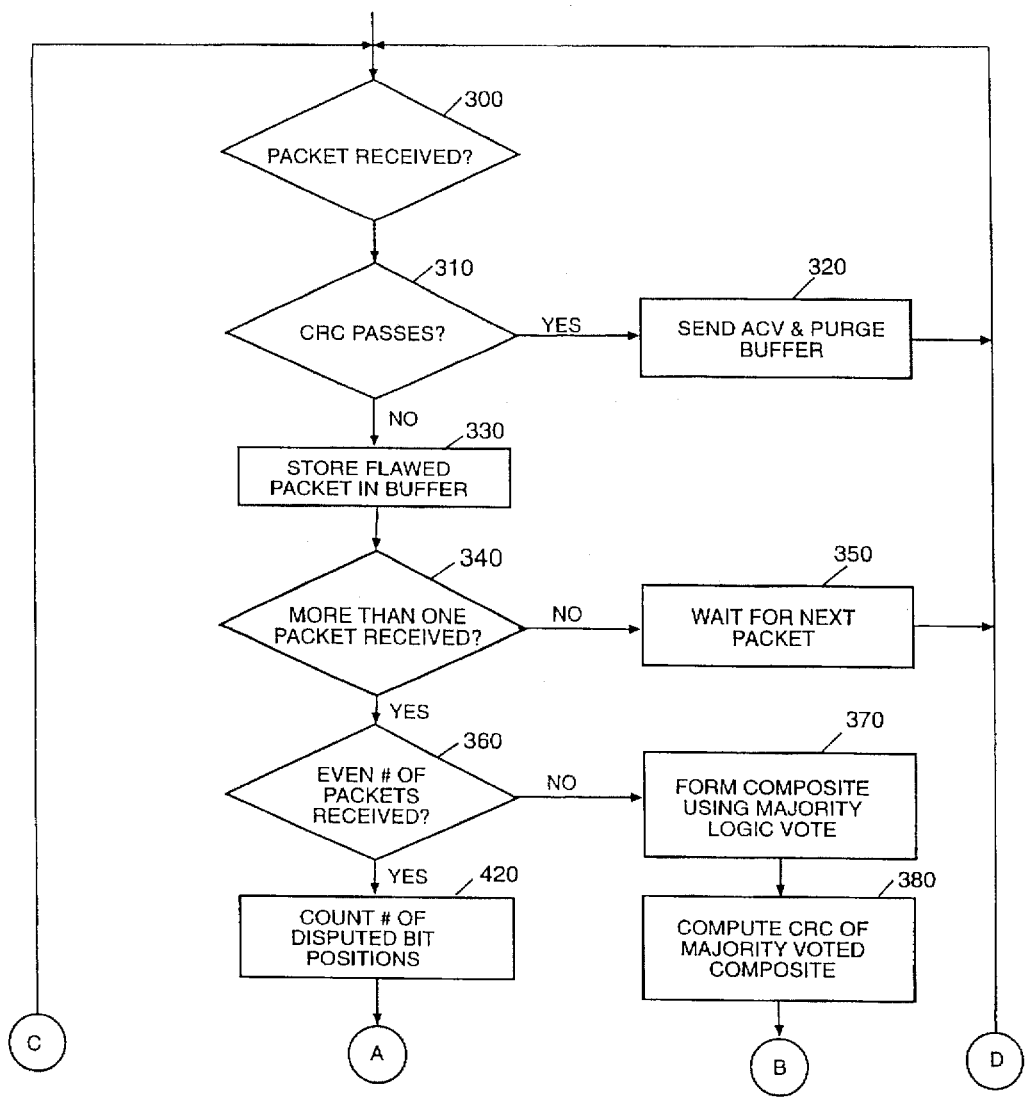
FIGS. 3A and 3B show the operation of an improved terminating module of an ARQ protocol according to the present invention.
Figure 3B:
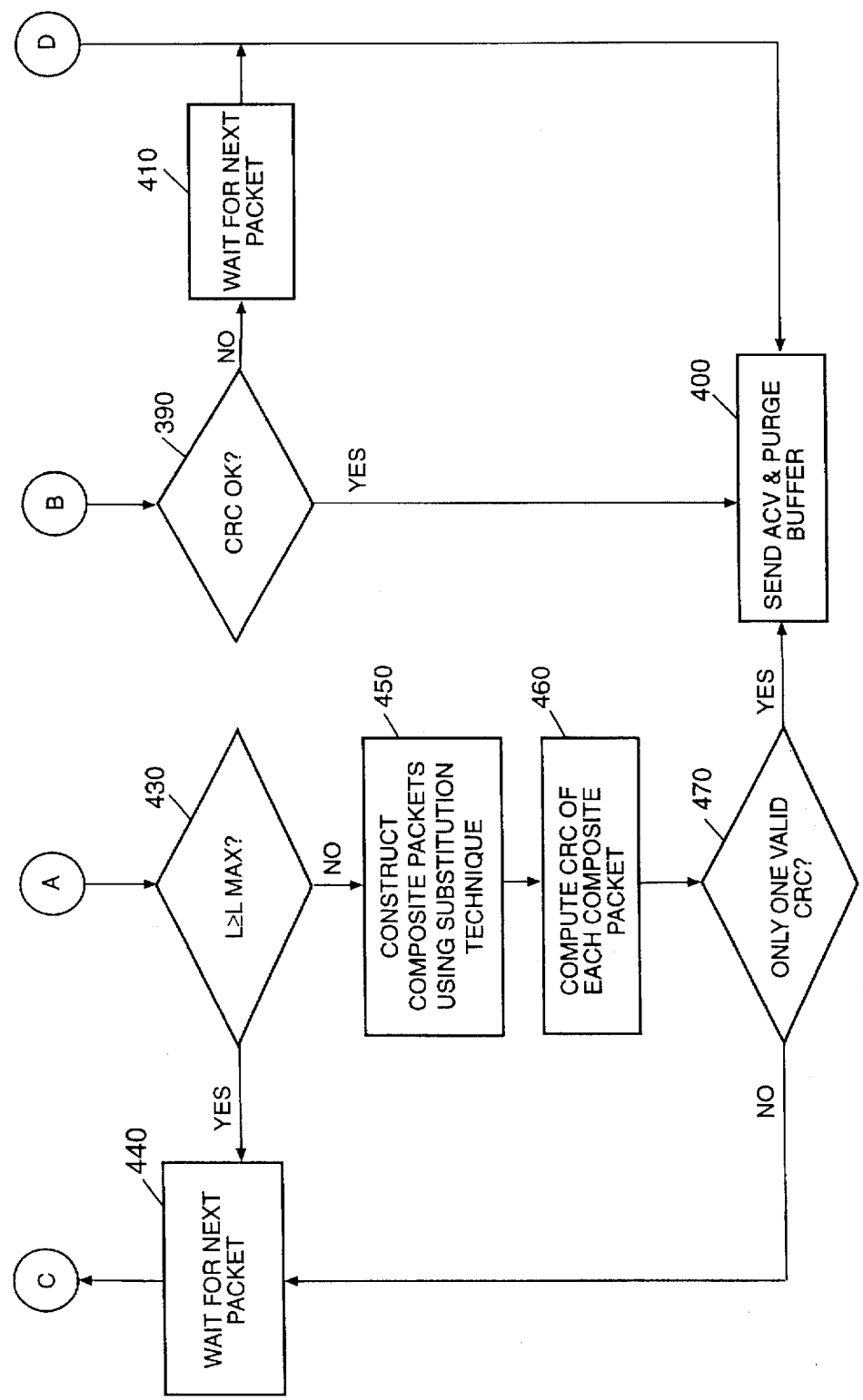

FIGS. 3a and 3b show the operation of an improved terminating module according to the present invention. When a packet is received (block 300), the terminating module 120 computes the cyclic redundancy check (CRC) of each incoming packet and examines the results (block 310). If the CRC passes, the terminating module 120 sends an ACK to module 110 over the communication link 130 and purges a buffer whose function is described more fully below (block 320). The terminating module 120 then awaits the arrival of the next packet. Otherwise (i.e., the CRC fails), the flawed packet is stored in the buffer (block 330). The terminating module 120 then examines the buffer area, and counts the number of packets present (block 340). If one packet is in the buffer (the packet just put there), module 120 awaits the arrival of the next packet (block 350).

If two or more packets are in storage, the terminating module 120 determines whether an odd or even number of packets is present in the buffer (block 360). If there is an odd number of packets, a single composite packet is formed by a majority logic voting technique (block 370). Using this technique, the value of any disputed bit position is assigned by a simple majority vote at each disputed position. For example, if a majority vote is performed on three replications, two of the three replications will have one value which is assigned to the disputed bit position. There is a high probability that the majority vote result corresponds to the correct bit value. After the composite packet is formed, a CRC check is performed on the majority voted packet (block 380 and 390). If the CRC check passes, the terminating module sends an ACK to the originating module (Block 400) and purges the buffer. Otherwise (i.e., the CRC fails), the terminating module 120 waits for the next packet (block 410).

Figure 4:
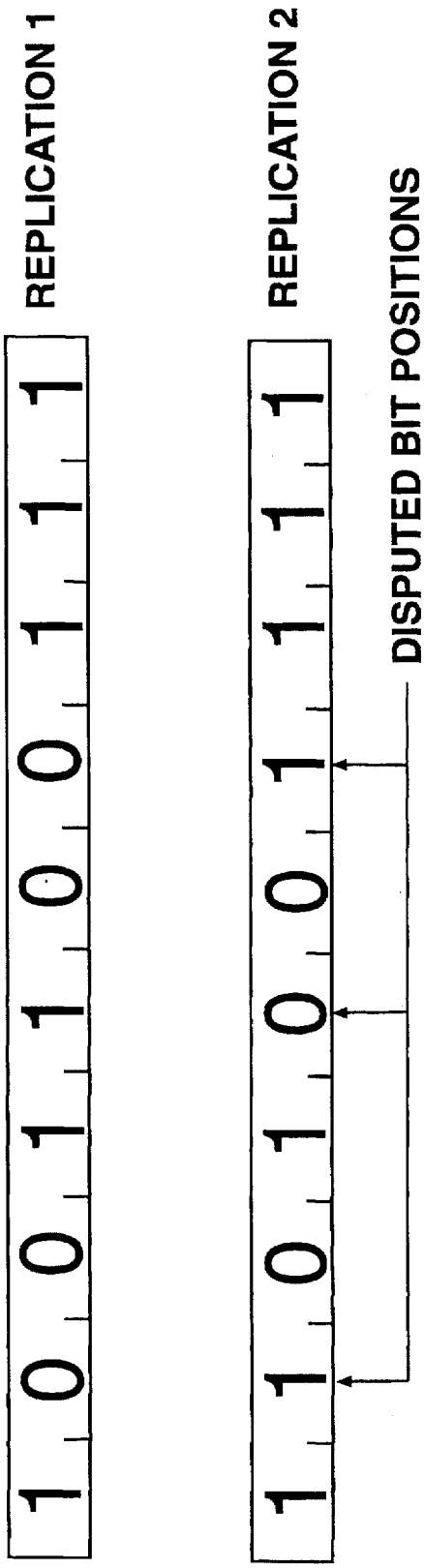
FIG. 4 shows an example of two packets each having ten bit positions, three of which are in dispute.

The majority logic voting technique does not work well when there is an even number of packets because of the possibility of a tie. Accordingly, a substitution technique is used to create composite packets when there is an even number of flawed replications. (Block 360) In this case, the terminating module 120 counts the number of bit positions in dispute (block 420). To do this, the replications of the packet stored in the buffer are compared bit-position by bit-position. If all the replications agree on the contents of a particular bit position, then that position is not in dispute. Otherwise, the bit position is counted once as being in dispute. FIG. 4 shows an example of two replications compared, each replication having ten bits, the two replications together having three disputed bit positions.

As shown in FIG. 3, the number of disputed bit positions is compared with a threshold $L_{MAX}$ (block 430). If the number of disputed bit positions equals or exceeds $L_{MAX}$, module 120 awaits the arrival of the next packet (block 440). Otherwise (i.e., the number of disputed bit positions is less than $L_{MAX}$), module 120 forms a composite packet or packets (block 450). A series of composite packets are generated containing all possible combinations of values at the disputed bit positions. If there are two disputed bit positions, then there are four possible combinations. If there are three disputed bit positions, then there are eight possible combinations.

FIG. 5 illustrates the construction of the set of composite packets. As shown in FIG. 5, all members of the set of composite packets have the same bit values as the two received packets held in the buffer in all bit positions where the two received packets agree themselves. For each bit position wherein the two received packets differ—i.e., the disputed bit positions—an element of the set of composites is formed with a "one" in the disputed bit position, and another element is formed with a "zero" in the disputed bit position. In this way, all possible transmitted bit patterns are reconstructed, under the assumption that all bits received the same way in the two stored packets—i.e., the bits in the undisputed bit positions—were received without error. From this set of $2^L$ elements, the bit patterns corresponding to the two packets held in storage are eliminated, as they are believed a priori to contain transmission errors.

The terminating module 120 next computes and examines the CRC of each member of the set of composite packets (block 460), and determines the number of composite packets having a valid frame check sequence (block 470). If exactly one has a valid frame-check sequence, module 120 sends an ACK to module 110 and purges the buffer (block 400). Otherwise, (i.e., the number of composite packets having a valid frame-check sequence is not exactly one), module 120 withholds the ACK and awaits the arrival of the next packet (block 440).

Threshold $L_{MAX}$ is computed and varied according to system and performance considerations. In the preferred embodiment described here, the value of $L_{MAX}$ is chosen so as to limit the possibility of transmission errors going undetected by the CRC, which increases as the number of disputed bits increases. Analytic techniques for computing the probability of such undetected errors are taught in the literature (see, for example, Boudreau, et al, "Performance of a Cyclic Redundancy Check and its Interaction With a Data Scrambler," IBM Journal of Research and Development, vol. 38, no. 6 (November 1994), pp. 651–658.

In another embodiment of the present invention, the value of $L_{MAX}$ is chosen or varied as a function of available processor cycles, so that an upper limit is set on the processor resources devoted to exploring the set of composites. The purpose of establishing or varying the upper limit is to free-up processor resources for use otherwise or in response to changing circumstances. In one variation of this embodiment, the value of $L_{MAX}$ would be set according to the relationship:

$$L_{MAX}=\log((T/N)+M), \text{ where}$$

T is the total number of processor instruction cycles presently available for processing a set of composite packets.

M is the number of flawed packets stored in buffer.

N is the number of instruction cycles needed to process a single member of the set of composite packets.

log is the base-2 logarithm, rounded down to the nearest integer.

In yet another embodiment of the present invention, the value of $L_{MAX}$ is chosen or varied as a function of available battery capacity, so that an upper limit is set on the energy expended by the processor in exploring the set of composites. Energy expenditure is a concern in a battery-powered receiver implementing the terminating DLC module. In one variation of this embodiment, the value of $L_{MAX}$ would be set according to:

$$L_{MAX}=\log((E_T/E_N)+M), \text{ where}$$

$E_T$ is the total battery capacity presently available for processing a set of composite packets.

M is the number of flawed packets stored in buffer.

$E_N$ is the battery capacity needed to process a single member of the set of composite packets.

log is the base-2 logarithm, rounded down to the nearest integer.

In other embodiments of the present invention, the majority-logic vote among three received packets is replaced by an expansion of the set of composite packets and examination of the CRC of each, looking for one element whose CRC is valid. In this expansion, all of the possible variations of the received information are computed, wherein bits received the same way in two stored packets are held to be correct, or wherein bits received the same way in three stored packets are held to be correct, or wherein bits received the same way in two or three stored packets are held to be correct.

Figure 6:
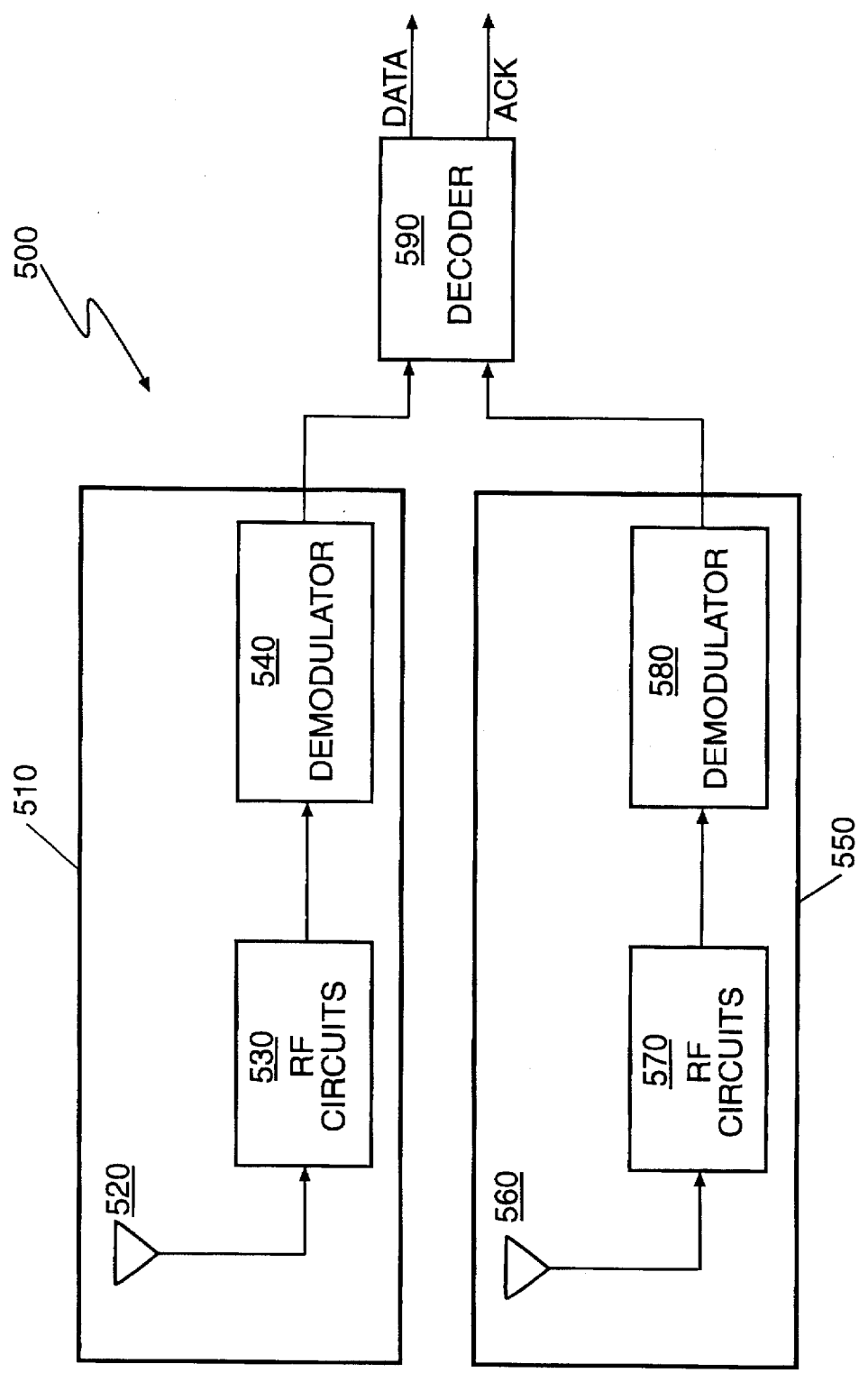
FIG. 6 shows the basic structure of a dual-chain diversity receiver capable of providing physical-layer support for the inventive terminating module.

The substitution technique used by the terminating module 120 when an even number of packets is received is also useful in a diversity receiver. FIG. 6 shows the structure of a two-chain diversity receiver which is indicated generally by the numeral 500. In FIG. 6, two receiver chains develop two replications of each incoming packet. Chain 510 comprises antenna 520, RF circuitry 530, and demodulator 540. Chain 550 comprises antenna 560, RF circuitry 570, and demodulator 580. Antennas 520 and 560, which are spatially removed from each other in order to provide reception diversity, receive the incoming signal. RF circuits 530, 570 and demodulators 540, 580 function according to the well-known principles that govern modem demodulators, convert the RF signals to digital bit streams, the output of each being a replication of the incoming packet. Decoder 590 implements the terminating module. Decoder 590 accepts the incoming packet replications, and outputs a correct version of the data and an ACK-authorization.

Figure 7A:
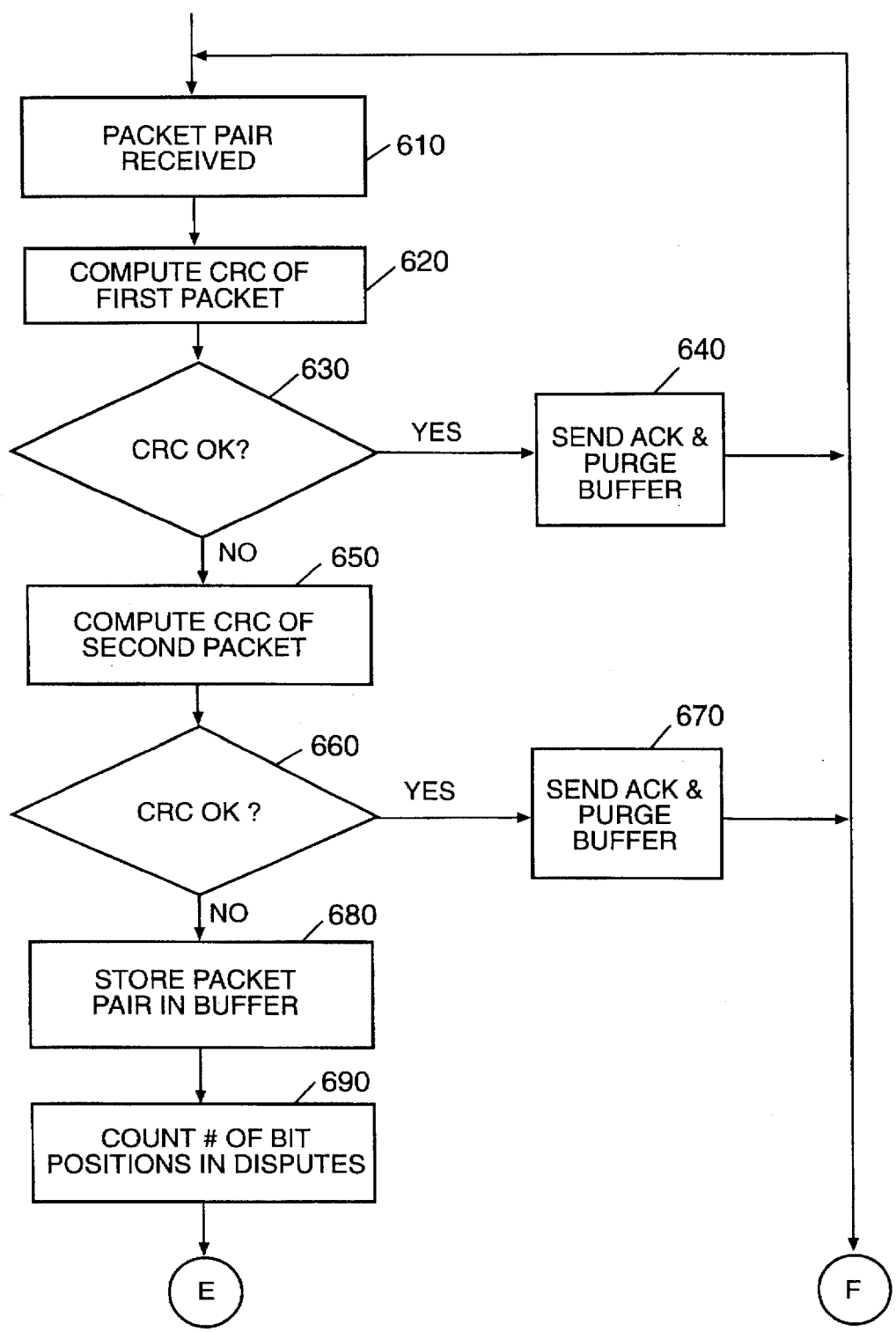
FIGS. 7A and 7B show the operation of the inventive terminating module as embodied in a dual-chain diversity receiver.
Figure 7B:
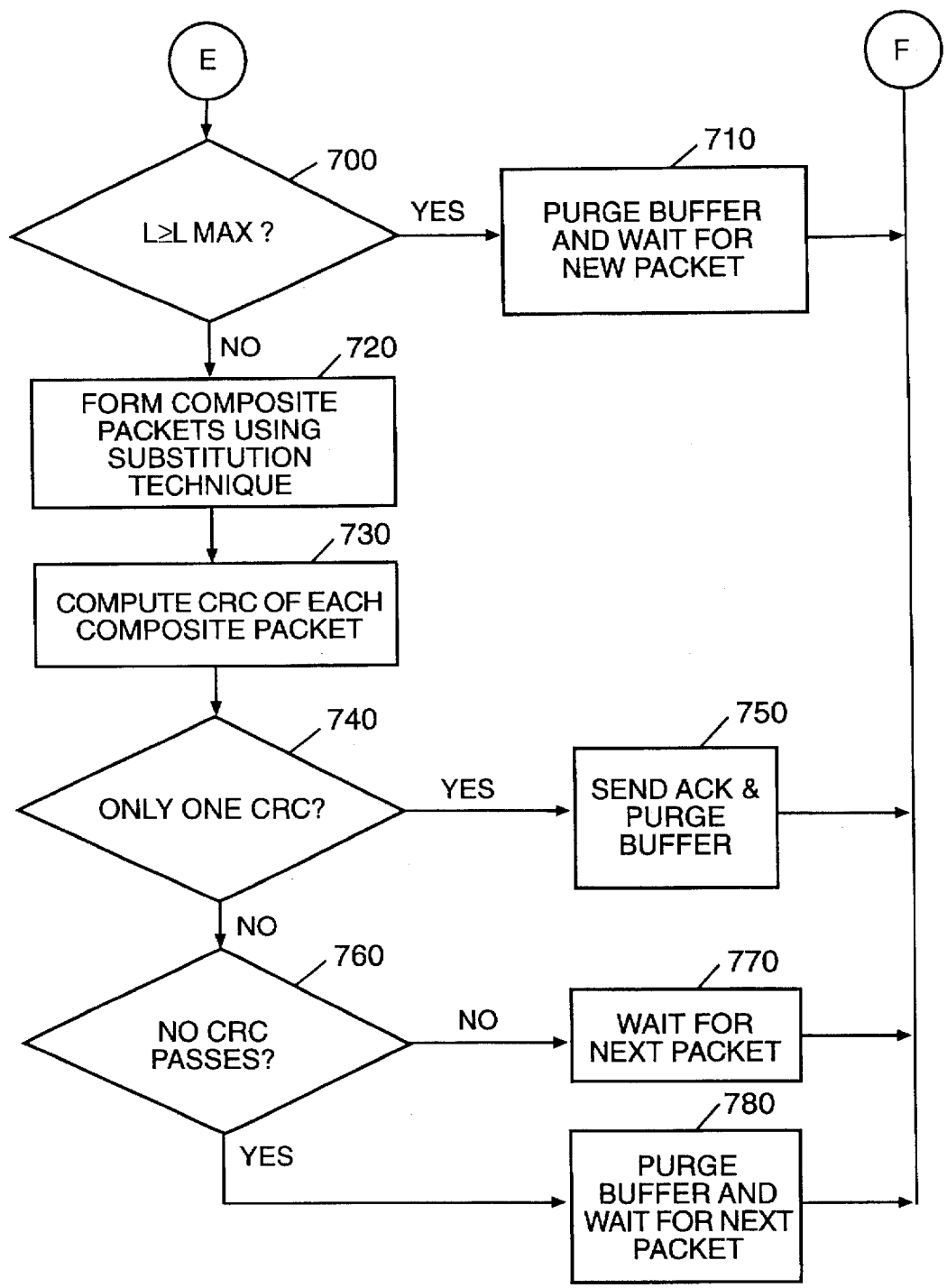

FIGS. 7a and 7b show the operation of the improved terminating module as embodied in a diversity receiver, which inherently generates packet replications in pairs, owing to the two-chain nature of the receiver.

When a packet pair is received (block 610), the diversity receiver 500 computes the CRC of a first packet (block 620). If the CRC of the first packet is valid (block 630), the diversity receiver sends an ACK to the originating module and purges the buffer (block 640). Otherwise (i.e., the CRC check fails), the CRC of the second packet in the pair is checked (block 650). If the CRC of the second packet passes (block 660), the diversity receiver sends an ACK to the originating module and purges the buffer (block 670). If neither packet passes the CRC check, both packets are stored in a buffer (block 680). All packets stored in the buffer are then compared to determine the number of disputed bit positions (block 690). The number of disputed bit positions is compared with a threshold $L_{MAX}$ (block 700). If the number of disputed bit positions exceeds the threshold $L_{MAX}$, the buffer is purged and the diversity receiver waits for a new packet pair (block 710). If the number of disputed bit positions is less than the threshold $L_{MAX}$, a series of composite packets are formed using the substitution technique previously described (block 720). The diversity receiver then computes the CRC of each composite packet (block 730). If only one composite packet has a valid CRC (block 740), the diversity receiver sends an ACK to the originating module and purges the buffer (block 750). If no composite packet has a valid CRC (block 760), the buffer is purged and the diversity receiver waits for a new packet pair to be transmitted (block 780). If more than one composite packet passes (block 760), the diversity receiver withholds the ACK and waits for the next packet to be received (block 770).

This disclosure has described what is considered to be a preferred embodiment of the invention, along with several variations. Other variations and modifications of these ideas will occur to those skilled in the art once they become aware of the basic concepts of the invention, particularly the extension of the present invention to encompass go-back-N ARQ system variations, selective-repeat ARQ system variations, ARPANET ARQ system variations, and other related ARQ system variations. Therefore, what is contained in the claims that follow is by way of description and not by way of limitation.

In the description of the present invention made so far, it has been assumed that various packets transmitted by the originating module 110 to the terminating module 120 are identical. There are certain circumstances, however, where a retransmitted packet may be different from the packet previously transmitted which was not accepted by the terminated module 120. In certain communication protocols, part of the information protected by the CRC changes when source information is retransmitted. For example, a data packet often comprises a header field which carries information concerning synchronization, sequencing, addressing, network management, or other information not used by the upper layers of the communication protocol. For example, the header fields may include a sequence number that will change when information is retransmitted. Because the CRC is computed on the header field as well as the information field, any changes to the header made between two transmissions will result in a change to the CRC even though the information field remains the same. Consequently, the various replications of a data packet received by the terminating module 120 must be altered before the various replications can be compared with one another.

The present invention provides a method for altering received packets at the terminating module 120 to allow the majority logic voting technique and the substitution technique described herein to be used in those situations where part of the information transmitted varies between transmissions. The present invention takes advantage of the linearity property of the cyclic redundancy check to manipulate the data packets to cancel out the effects of the changed information. This method applies to any linear error control code, and is not restricted just to systematic cyclic redundancy checks.

Figure 8:
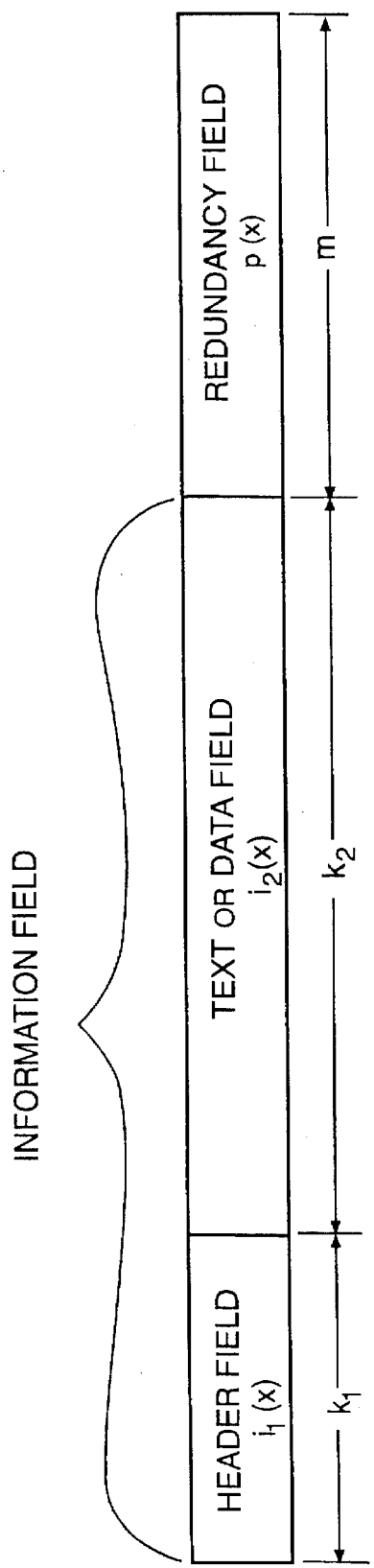
FIG. 8 is an illustration of a data packet which is transmitted between the originating and terminating module.

The inventive method for altering replications is most readily described through operations on polynomials having modulo-2 coefficients. FIG. 8 shows a schematic representation of a data packet. The data packet contains an information field and a redundancy field. The information field is subdivided into a header field which contains $k_1$ bits, the text field contains $k_2$ bits, and the CRC field contains m bits. The header field is represented by the polynomial $i_1(x)$, the text field is represented by the polynomial $i_2(x)$, which together form the information field represented by the polynomial $i(x)=i_1(x)x^{k_2}+i_2(x)$. The transmitted codeword is represented by $c(x)$ and the generator polynomial defining the CRC check is represented by $g(x)$. The parity check bits are given by the following equation:

$$p(x) = rem \frac{i(x)x^m}{g(x)}$$

Then the transmitted codeword is written as $c(x)=i(x)x^m+p(x)$. It is important to note that for linear codes, $p(x)$ can be expressed as the sum of the contributions of $i_1(x)$ and $i_2(x)$. That is, the parity check bits can be represented by the equation:

$$p(x)=p_1(x)+p_2(x)$$

where $p_1(x)$ represents the redundancy associated with the variable information field $i_1(x)$ and $p_2(x)$ represents the parity check bits associated with the fixed information field $i_2(x)$. $p_1(x)$ can be represented by the equation:

$$p_1(x) = rem \frac{i_1(x)x^m x^{k_2}}{g(x)}$$

$p_2(x)$ can be represented by the equation:

$$p_2(x) = rem \frac{i_2(x)x^m}{g(x)}$$

Whenever packets containing changed information are received by the terminating module 120, the differences in the received data packets which are attributable to any changes in the variable information field must be eliminated. This is accomplished by making the header fields in all received data packets equal. The redundancy fields in the altered replications are then recalculated to subtract any changes attributable to the redundancy vector attributable to the change in the header. These operations can be represented by the following equation:

$$r'(x)=r(x)+p_1(x)+i_1(x)x^m x^{k_2}$$

In the above equation, r(x) represents the received packet, and r'(x) represents the altered packet. With this method, differences that arise from header changes are removed from the data packets that have the same text fields. Consequently, the various altered replications r'(x) can be compared as previously described using majority logic voting techniques for odd numbers of packets and the substitution technique for even numbers of packets.

What follows is an example of the error detection method of the present invention. Assume that the transmitted packet contains a total of seven bits, $x^0$–$x^6$, with $x^0$ being the least significant bit. Bits $x^0$–$x^2$ are the parity bits represented by the vector p(x). Bits $x^3$ and $x^4$ are the text bits represented by vector $i_2(x)$. Bits $x^5$ and $x^6$ are the header bits represented by the vector $i_1(x)$. The generator polynomial g(x) is $x^3+x+1$. The values for $i_1$, (x), $i_2(x)$, and p(x) are as follows:

$i_1(x)=1=01$ (first transmission)

$i_1(x)=x=10$ (second transmission $i_2(x)=x+1=11$ (both transmissions)

p(x)=x=010 (first transmission)

p(x)=0=000 (second transmission

Thus, the first transmitted codeword is 0111010. The second transmitted codeword is 1011000.

During the first transmission, the error pattern $x^2$ is introduced so that the first received word r(x) is 0111110. A parity check reveals the error so the ACK is withheld and the received word is stored in a buffer. During the second transmission, the error pattern $x^4$ is introduced so that the second received word r(x) is 1001000. Again, the parity check reveals the error so the ACK is withheld. The second received word is also stored in the buffer.

The receiving unit attempts to reconstruct the transmitted packet using the substitution technique. However, the first and second received codewords cannot be directly compared because the header field changed between transmissions, although the text field remained the same. The first step in correcting the error is to alter the received codewords to eliminate the effect of the header field. First, the header bits are subtracted. Second, the redundancy vector $p_1(x)$ attributable to the header bits is subtracted. These operations are expressed by the equation:

$$r'(x)=r(x)+p_1(x)+i_1(x)x^3x^2=r(x)+p_1(x)+i_1(x)x^5$$

To construct r'(x), we need to calculate $p_1(x)$ according to the following equation:

$$p_1(x) = rem\left[\frac{i_1(x)x^5}{g(x)}\right]$$

For the first transmission, $p_1(x)$ is $x^2+x+1$. For the second transmission, $p_1(x)$ is $x^2+1$. Now r'(x) can be computed as follows:

First transmission $r'(x) = r(x) + p_1(x) + i(x)x^5$

| | | |
|---|---|---|
| $r(x)$ = | $x^5+x^4+x^3+x^2+x$ | → 0111 110 |
| $p_1(x)$ = | $x^2+x+1$ | → 0000 111 |
| $i(x)x^5$ = | $x^5$ | → 0100 000 |
| $r'(x)$ = | $x^4+x^3+1$ | → 0011 001 |

-continued

Second transmission $r'(x) = r(x) + p_1(x) + i_1(x)x^5$

| | |
|---|---|
| $r(x) = x^6+x^3$ | → 1001 000 |
| $p_1(x) = x^2+1$ | → 0000 101 |
| $i(x)x^5 = x^6$ | → 1000 000 |
| $r'(x) =$ | → 0001 101 |

Now, the two replications can be directly compared to determine the disputed bit positions as follows:

| | |
|---|---|
| First Replication | 0011 001 |
| Second Replication | 0001 101 |

The bit positions $x^2$ and $x^4$ are disputed in the two replications. Therefore, a set of composites are constructed substituting the values 1 and 0 into the disputed positions as follows:

Composite 1 → 0001001
Composite 2 → 0001101 - 2nd replication
Composite 3 → 0011001 - 1st replication
Composite 4 → 0011101

The second and third composite replications are ignored since they are duplicates of the two received replications which are already known to be in error. The parity of the two remaining composites are then checked.

Composite 1
$$rem\left[\frac{x^3}{x^3+x+1}\right] = x+1 = 011 \text{ not valid}$$

Composite 4
$$rem\left[\frac{x^4+x^3}{x^3+x+1}\right] = x^2+1 = 101 \text{ valid}$$

Composite 4 is the only composite that contains a valid parity check. Therefore, Composite 4 is assumed to contain the transmitted text field.

In the discussion above, it was assumed that r(x) was a hard output received packet. The present invention may also be used in connection with soft output received packet. A soft output received packet consist of real numbers, where a positive number indicates a 0, and a negative number indicates a 1. In order to subtract the effect of $i_1(x)$ from r(x), we need to construct $I_1(x)$ from $i_1(x)$, where a 0(1) in $i_1(x)$ becomes +1(−1) in $I_1(x)$. Similarly, we construct $P_1(x)$ from $p_1(x)$. We now compute:

$$r'(x)=r(x)(P_1(x)+I_1(x)x^{m}x^{l_2})$$

Again, r'(x) now depends on $i_2(x)$ only. Finally, we can combine the L repetitions of r'(x), using a conventional soft combining technique. The resulting soft output word r"(x) can now be turned into a hard output word in the usual way, by turning positive values into 0, and negative values into 1. Finally, the CRC is checked.

The present invention may, of course, be carried out in other specific ways than those herein set forth without departing from the spirit and essential characteristics of the invention. For example, the particular dimensions used in describing the prototype of the convection oven built according to the present invention are not intended to limit the scope of the claims, but are provided only as examples. The present embodiments are, therefore, to be considered in all respects as illustrative and not restrictive, and all changes coming within the meaning and equivalency range of the appended claims are intended to be embraced therein.

What is claimed is:

1. A method for correcting errors in a plurality of flawed replications of a transmitted packet which includes a variable information field and a fixed information field said method comprising:
   a) changing the variable information field in at least one of said flawed replications to make the variable information fields in all replications equal;
   b) recalculating the redundancy fields in the altered replications to subtract the redundancy vectors attributable to the changes in the variable information field;
   c) comparing said altered replications to determine the disputed bit positions;
   d) generating at least one composite packet based on a comparison of the multiple iterations of the flawed replication, wherein said multiple iterations include at least one altered replication; and
   e) determining the validity of said composite packet(s).

2. The method according to claim 1 wherein the composite packet is generated by majority-logic vote at the disputed bit position.

3. The method according to claim 1 wherein the composite packet is generated by a substitution technique in which a plurality of composite packets are generated by substituting all possible combinations of values at the disputed bit positions into a string contained the undisputed bits.

4. A method for correcting errors in a plurality of flawed replications of a transmitted packet which includes a variable information field and a fixed information field said method comprising:
   a) selecting one replication as a reference;
   b) changing the variable information field in the remaining replications to make the variable information fields in all replications equal;
   c) recalculating the redundancy fields in the altered replications to subtract the redundancy vector attributable to the changes in the variable information field;
   d) comparing said replications to determine the disputed bit positions;
   e) determining the validity of said composite packet(s); and
   f) determining the validity of said composite packets.

5. The method according to claim 4 wherein the composite packet is generated by majority-logic vote at the disputed bit position.

6. The method according to claim 4 wherein the composite packet is generated by a substitution technique in which a plurality of composite packets are generated by substituting all possible combinations of values at the disputed bit positions into a string contained the undisputed bits.

7. A method for correcting errors in a plurality of flawed replications of a transmitted packet which includes a variable information field and a fixed information field said method comprising:
   a) changing the variable information field in each replication to a predetermined value;
   b) recalculating the redundancy fields in each replication to subtract the redundancy vector attributable to the changes in the variable information field;
   c) comparing said altered replications to determine the disputed bit positions;
   d) generating at least one composite packet based on a comparison of the multiple iterations of the flawed replication, wherein said multiple iterations include at least one altered replication; and
   e) determining the validity of said composite packet(s).

8. The method according to claim 7 wherein the composite packet is generated by majority-logic vote at the disputed bit position.

9. The method according to claim 7 wherein the composite packet is generated by a substitution technique in which a plurality of composite packets are generated by substituting all possible combinations of values at the disputed bit positions into a string contained the undisputed bits.

10. A method for altering a received codeword having a variable information field, a fixed information field, and a redundancy field to allow comparison with another received codeword having the same fixed information field comprising:
    a) changing the variable information field in the received codeword; and
    b) recalculating the redundancy field in the received codeword to eliminate the redundancy vector attributable to the changes in the variable information field.

11. The method according to claim 10 wherein the variable information field is altered to make it equal to the variable information field in the other received codeword.

12. The method according to claim 10 wherein the variable information field is altered to make it equal to a predetermined value.

13. An error correcting method for correcting errors in a diversity receiver where multiple copies of the transmitted data packet are received, said error correcting method comprising the steps of:
    a) comparing the multiple copies of said received data packet to determine the disputed bit positions;
    b) creating a set of composite packets by substituting all possible combinations of values at the disputed bit positions into a string containing the undisputed bit positions;
    c) determining the validity of each composite packet; and
    d) if only one composite packet is valid, outputting the valid composite packet.

14. The error correcting method of claim 13 further including the step of comparing the number of disputed bit positions with a predetermined threshold before creating the composite packets.

15. The error correcting method of claim 14 wherein the composite packets are created only when the number of disputed bit positions is less than said predetermined threshold.

16. The error correcting method according to claim 14 wherein said predetermined threshold is a function of battery capacity.

17. The error correcting method according to claim 14 wherein said predetermined threshold is a function of available processor instruction cycles.

* * * * *